(12) United States Patent
Do et al.

(10) Patent No.: US 7,176,621 B2
(45) Date of Patent: Feb. 13, 2007

(54) THIN FILM ELECTROLUMINESCENCE DISPLAY DEVICE AND METHOD OF MANUFACTURING THE SAME

(75) Inventors: Young-Rag Do, Seoul (KR); Yoon-Chang Kim, Suwon (KR); Ji-Hoon Ahn, Seoul (KR); Sang-Hwan Cho, Suwon (KR); Joon-Gu Lee, Goyang (KR)

(73) Assignee: Samsung SDI Co., Ltd., Suwon-si (KR)

( * ) Notice: Subject to any disclaimer, the term of this patent is extended or adjusted under 35 U.S.C. 154(b) by 165 days.

(21) Appl. No.: 10/715,416

(22) Filed: Nov. 19, 2003

(65) Prior Publication Data
US 2004/0169465 A1    Sep. 2, 2004

(30) Foreign Application Priority Data
Feb. 13, 2003 (KR) ............... 10-2003-0009094

(51) Int. Cl.
*H01J 1/70* (2006.01)
(52) U.S. Cl. .................... 313/506; 313/498
(58) Field of Classification Search ........ 313/506–509, 313/498, 503; 445/24, 25; 428/917
See application file for complete search history.

(56) References Cited

U.S. PATENT DOCUMENTS

| | | | | |
|---|---|---|---|---|
| 4,774,435 A * | 9/1988 | Levinson | ............... | 313/509 |
| 5,352,543 A * | 10/1994 | Ryu | ............... | 428/690 |
| 5,936,347 A * | 8/1999 | Isaka et al. | ............... | 313/509 |
| 6,181,063 B1 * | 1/2001 | Shishido | ............... | 313/509 |
| 6,392,338 B1 * | 5/2002 | Hori et al. | ............... | 313/504 |
| 6,433,487 B1 * | 8/2002 | Yamazaki | ............... | 315/169.3 |
| 6,476,550 B1 | 11/2002 | Oda et al. | | |
| 6,666,991 B1 * | 12/2003 | Atarashi et al. | ...... | 252/301.4 R |
| 6,677,703 B2 * | 1/2004 | Ito et al. | ............... | 313/478 |
| 6,833,667 B2 * | 12/2004 | Hamano et al. | ............... | 313/504 |
| 6,898,018 B2 * | 5/2005 | Minoura et al. | ............... | 359/627 |
| 2004/0227462 A1 * | 11/2004 | Utsumi et al. | ............... | 313/506 |
| 2004/0239240 A1 * | 12/2004 | Kato | ............... | 313/506 |

FOREIGN PATENT DOCUMENTS

JP    2001-176671    6/2001
WO    WO 00/70691    * 11/2000

OTHER PUBLICATIONS

Marriam-Webster OnLine, definition of corrugate, wave, curvilinear, geometric and undulation, obtained from www.m-w.com.*
Jones, et al. "Pulsed Laser Deposition of $Y_2O_3$: Eu Thin Film Phosphors", Elsevier Science B.V., Displays 19 (1999) pp. 151-167.
C. Sella, et al., "R.F.-Sputtered Luminescent Rare Earth And Yttrim Oxysulfide Films," Electronics and Optics, Thin Solid Films, Sep. 21-25, 1982; pp. 181-185.

* cited by examiner

*Primary Examiner*—Edward J. Glick
*Assistant Examiner*—Anastasia S. Midkiff
(74) *Attorney, Agent, or Firm*—Stein, McEwen & Bui, LLP

(57) ABSTRACT

An electroluminescence display device including a substrate, a corrugated structure formed on the substrate, wherein the corrugated structure disperses light through diffraction and reflection; and a first electrode layer, a first insulation layer, a fluorescent layer, a second insulation layer, and a second electrode layer sequentially formed on the substrate to follow the shape of the corrugated structure.

27 Claims, 7 Drawing Sheets

THIN FILM ELECTROLUMINESCENCE DISPLAY DEVICE AND METHOD OF MANUFACTURING THE SAME

CROSS-REFERENCE TO RELATED APPLICATIONS

This application claims the priority of Korean Patent Application No. 2003-9094, filed on Feb. 13, 2003, in the Korean Intellectual Property Office, the disclosure of which is incorporated herein in its entirety by reference.

BACKGROUND OF THE INVENTION

1. Field of the Invention

The present invention relates to an electroluminescence display device and a method of manufacturing the same, and, more particularly, to an electroluminescence display device which is provided with an improved substrate and thin-film layers, thereby achieving an improvement in light output efficiency depending on the refractive index of each thin film, and a method of manufacturing the same.

2. Description of the Related Art

Generally, electroluminescence display devices are high-level image display devices. They are flat display devices having many advantages such as a small size, a light weight, environmental resistance, durability, a long life span, and a wide viewing angle.

In electroluminescence display devices, when a voltage is applied to both ends of a fluorescent layer, electrons are accelerated toward the inside of the fluorescent screen so as to collide with an atom, i.e., a luminescence center. Thus, the electrons at the electron level of the atom are excited to a higher energy level, and then make a transition to a ground state. At this time, due to an energy gap around the electrons, light having a particular wavelength range is produced, that is, an electroluminescence phenomenon occurs.

Electroluminescence display devices are divided into alternating current (AC) drive types and direct current (DC) drive types, or thin-film types and thick-film types. Such electroluminescence display devices usually have at least one insulation layer and at least one fluorescent layer, and are provided with an electrode, which applies a voltage to both ends of the fluorescent layer. In order to improve the characteristics of the insulation layer and the fluorescent layer, these layers can be formed in a multilayer structure having a plurality of thin films made of different materials.

FIG. 1 shows an example of an AC drive type thin-film electroluminescence display device. Referring to FIG. 1, a first electrode layer 11, a first insulation layer 12, a fluorescent layer 13, a second insulation layer 14, and a second electrode layer 15 are sequentially formed on a substrate 10. The fluorescent layer 13 can be made of a metal sulfide such as ZnS, SrS, or CsS, an alkaline-earth potassium sulfide such as $CaCa_2S_4$ or $SrCa_2S_4$, or a metal oxide. For the atoms, i.e., luminescence centers, contained in a material of the fluorescent layer 13, transition metals containing Mn, Ce, Tb, Eu, Tm, Er, Pr, or Pb or alkaline ash metals can be used.

Another example of an electroluminescence display device is disclosed in Japanese Patent Publication No. 2001-176671. This electroluminescence display device has a structure in which a first electrode, an insulation layer of an inorganic compound, a luminescence layer of an inorganic compound, and a second electrode are stacked on a substrate.

In the electroluminescence display device shown in FIG. 1, when a predetermined voltage is applied to the first and second electrode layers 11 and 15 located at both sides of the fluorescent layer 13, light having a particular wavelength is produced due to an electroluminescence phenomenon.

In such an electroluminescence display device, a substantially flat thin film forms the top surface of each of the fluorescent layer 13 and the first and second electrode layers 11 and 15, and the refractive index of the first and second electrode layers 11 and 15 is high, so most of the light produced in the fluorescent layer 13 is not transmitted through the fluorescent layer 13 and the second electrode layer 15. Accordingly, only about 10% of the light is radiated from the electroluminescence display device.

More specifically, light efficiency of an electroluminescence display device is divided into internal efficiency and external efficiency. While the internal efficiency depends on the characteristics of the fluorescent layer, i.e., luminescence material, the external efficiency depends on the refractive index of each layer constituting the display device. The external efficiency $\eta_{ex}$ can be expressed as $\eta_{ex}=\eta_{in}\times\eta_{out}$. Here, $\eta_{in}$ denotes the internal efficiency $\eta_{out}$ denotes output coupling efficiency. A major restriction on the output coupling efficiency in a thin film electroluminescence display is related to the extraction of light generated inside the device to the external environment. The large mismatch between the refractive index of the thin film phosphor and air results in a large proportion of the light rays undergoing total internal reflection. Some of the light generated inside the thin film phosphor thus becomes trapped, unable to escape into the air. This effect plagues EL structures employing the thin film phosphor. According to Snell's law, only light emitted at an angle less than the critical angle can escape from the surface, all other light is internally reflected back into the device. A fluorescent layer made of a material such as ZnS usually has a high refractive index, and thus has a low output efficiency. The output efficiency depends on the formula $\eta_e=(2n^2)^{-1}$. Here, "n" denotes the refractive index of a fluorescent layer.

According to the above formula, in the case of a ZnS-based fluorescent layer, "n" is 2.5, so only about 8% of the light is output, while most of the light is guided between thin-film layers of the image display device and disappears.

In order to overcome the above problem, there has been proposed a method of adjusting the grain size of a fluorescent layer in an electroluminescence display device to provoke scattering on the surface of a substrate made of glass, thereby increasing the output of light. This method is effective when only a thin film fluorescent layer is formed on a substrate, but is, not significantly effective when an electrode layer and an insulation layer are formed between a fluorescent layer and a substrate.

In order to increase the light output efficiency of a fluorescent layer, a method of adjusting the partial pressure of $O_2$ to 200 or greater mtorr during the formation of the fluorescent layer, so as to increase a nodule dimension to 100 nm, was proposed (S. I. Jones, D Kumar, K.-G. Cho, R. Singh, and P. H. Holloway, 1999, *Displays*, 19, 151), and a method for increasing a light output characteristic by four times using a rough glass substrate was proposed (Sella, C.; Martin, J.; Charreire, Y. 1982, *Thin Solid Films*, 90, 181).

Since light is prevented from being guided by only a particular thin-film layer, these methods have a limitation in increasing light output efficiency.

U.S. Pat. No. 6,476,550 discloses an organic electroluminescence display device including a thin film having a rugged surface for diffracting light.

SUMMARY OF THE INVENTION

The present invention provides an electroluminescence display device which prevents light from being guided between a substrate and thin-film layers, i.e., an insulation layer, a fluorescent layer, and an electrode layer, due to a difference in refractive index there between, and diffracts light, thereby increasing light output efficiency, and a method of manufacturing the same.

The present invention also provides an electroluminescence display device which improves the luminance of an image by increasing light output efficiency so that an image can be formed through inorganic thin-film electroluminescence, and a method of manufacturing the same.

The present invention also provides an electroluminescence display device, which reduces light loss using a light dispersion effect at the interface between a high-refractive index layer and a low-refractive index layer, and a method of manufacturing the same.

Additional aspects and/or advantages of the invention will be set forth in part in the description which follows and, in part, will be obvious from the description, or may be learned by practice of the invention.

According to an aspect of the present invention, there is provided an electroluminescence display device including a substrate; a corrugated structure formed on the substrate, wherein the corrugated structure disperses light through diffraction and reflection; and a first electrode layer, a first insulation layer, a fluorescent layer, a second insulation layer, and a second electrode layer sequentially formed on the substrate to follow the shape of the corrugated structure.

The corrugated structure may comprise a plurality of dots having a cylindrical shape or a polygonal cone shape, and arranged in a predetermined pitch. The corrugated structure may comprise a material having a substantially the same refractive index as the substrate. The corrugated structure may comprise transparent $SiO_2$ or polyimide.

A pitch between corrugating members of the corrugated structure may be $\lambda/4$ to $4\lambda$ of a wavelength of light produced from the fluorescent layer. The fluorescent layer may comprise an oxide or sulfide having a refractive index of more than 1.6 as a base material. The fluorescent layer may have a higher refractive index than the adjacent layers.

According to another aspect of the present invention, there is provided an electroluminescence display device including a transparent substrate; a corrugated structure dispersing light through diffraction and reflection; and a first electrode layer, a first insulation layer, a fluorescent layer, a second insulation layer, and a second electrode layer sequentially formed on the substrate; wherein the corrugated structure is formed on the substrate or on at least one of the sequentially formed layers, and at least one of the sequentially formed layers is formed on the corrugated structure to follow a shape of the corrugated structure.

According to still another aspect of the present invention, there is provided a method of manufacturing an electroluminescence display device. The method includes preparing a transparent substrate; forming an insulation thin-film layer on the transparent substrate; forming a photoresist layer on the insulation thin-film layer; patterning the photoresist layer using a laser hologram; etching the patterned photoresist layer; and etching the insulation thin-film layer using the etched photoresist layer, thereby forming a corrugated structure which disperses light through diffraction and reflection.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
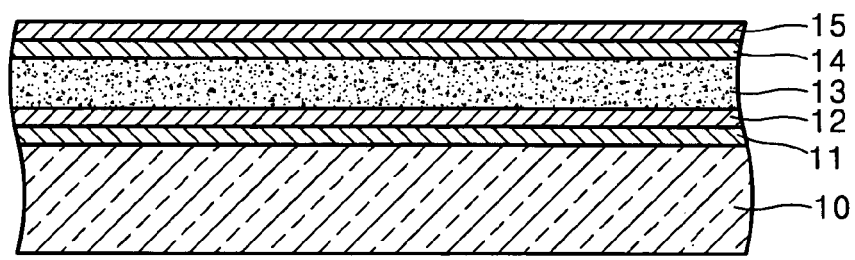
FIG. 1 is a cross-section of a conventional electroluminescence display device.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

In an electroluminescence display device according to an embodiment of the present invention, a corrugated structure for dispersing light through diffractive reflection is formed on the top surface of a substrate, or at least one layer among a plurality of thin-film layers stacked, and at least one layer is corrugatedly formed on the corrugated structure. An embodiment of an electroluminescence display device according to the present invention is shown in FIG. 2.

Figure 2:
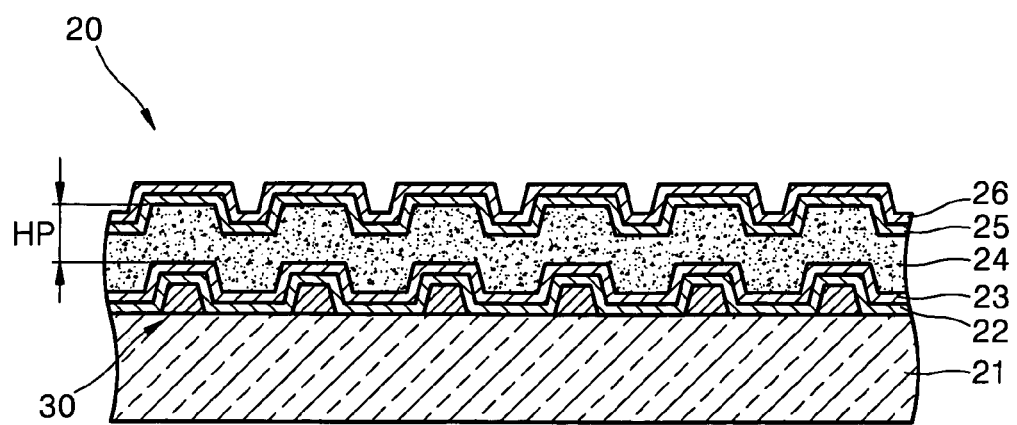
FIG. 2 is a cross-section of an electroluminescence display device according to an embodiment of the present invention.

Referring to FIG. 2, an electroluminescence display device 20 includes a transparent substrate 21 and a corrugated structure 30 formed on the substrate 21 in order to disperse light by diffracting and reflecting the light. The electroluminescence display device 20 also includes a first electrode layer 22, a first insulation layer 23, a fluorescent layer 24, a second insulation layer 25, and a second electrode layer 26, which are sequentially formed on the substrate 21 having the corrugated structure 30, following the surface shape of the structure 30.

The first electrode layer 22 may be made of a transparent material, i.e., indium thin oxide (ITO). The fluorescent layer 24 can be formed of a single patterned layer to emit single color light. Alternatively, the fluorescent layer 24 can be formed of red, blue, and green layers in a predetermined pattern to form a color image. In this case, the first and second electrode layers 22 and 26 can be formed in a matrix to be orthogonal to each other so that an electric field can be applied to both top and bottom surfaces of each red, blue, or green layer. It is preferable that the fluorescent layer 24 is made using a material such as an oxide or sulfide, having a refractive index (n) of at least 1.6, as a base material. The refractive index of the fluorescent layer 24 is not restricted to the above embodiment but is preferably greater than those of its adjacent layers, i.e., the first and second insulation layers 23 and 25. The first and second insulation layers 23 and 25 can be made of an oxide or sulfide.

Figure 3:
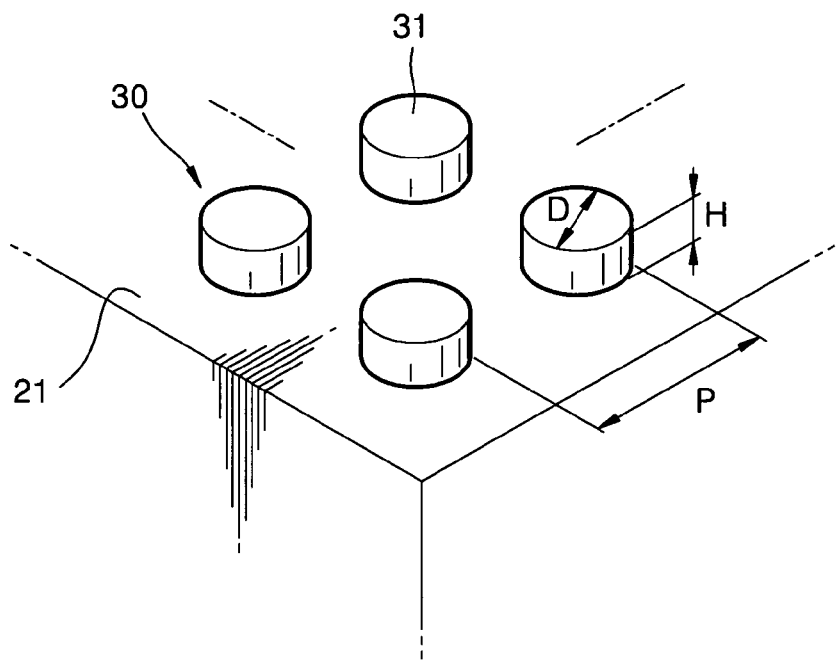
FIGS. 3 through 5 are perspective views of examples of a structure of an electroluminescence display device according to embodiments of the present invention.
Figure 4:
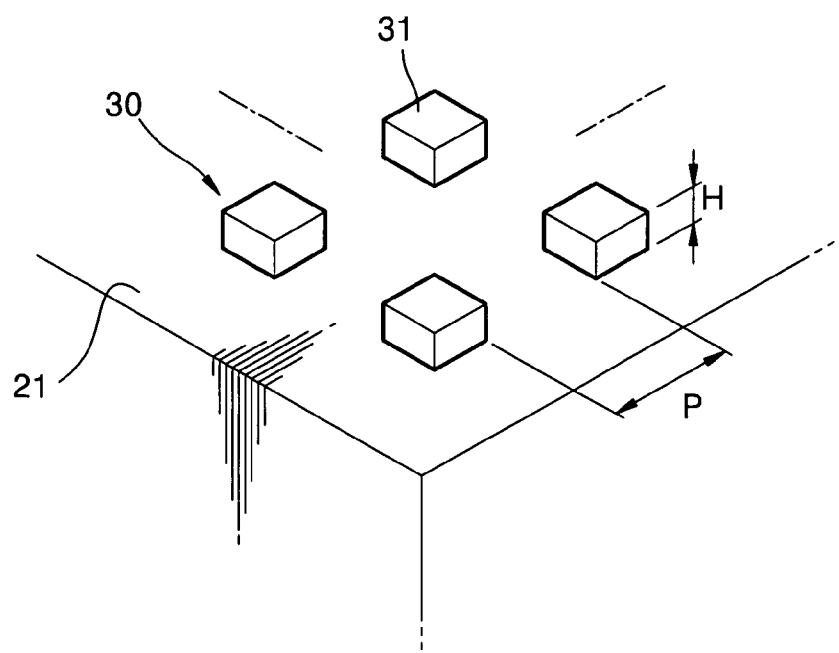
Figure 5:
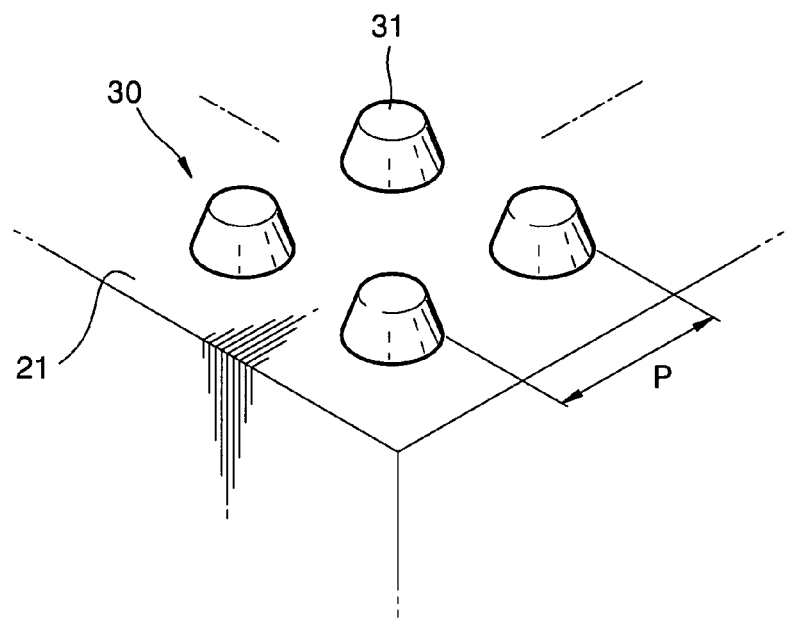
Figure 6:
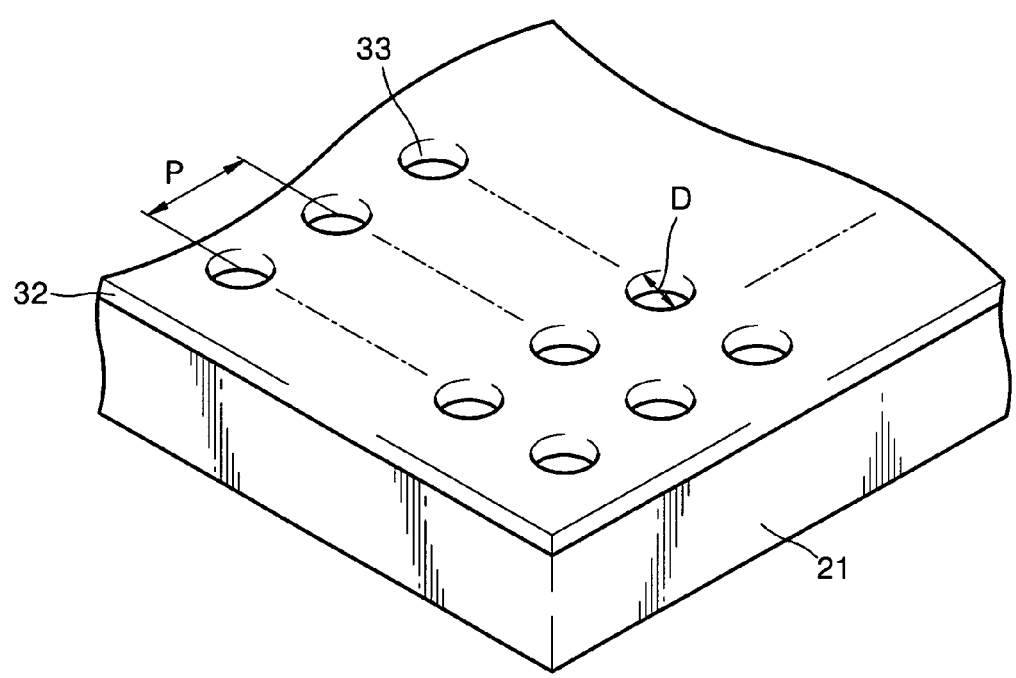
FIG. 6 is a perspective view of an example of a structure of an electroluminescence display device according to another embodiment of the present invention.

As shown in FIGS. 3 through 5, the corrugated structure 30, which is formed on the top surface of the substrate 21 in order to diffract and reflect light produced from the fluorescent layer 24 for the dispersion of the light, includes a plurality of dots 31 having a cylindrical shape, the shape of a square pillar, or a tapered circumference. The shape of the dots 31 is not restricted to the above embodiments of the present invention, but any shape having a predetermined pitch is possible. In another embodiment of the present invention, as shown in FIG. 6, a plurality of recessed holes 33 are formed in a predetermined pitch P in a substrate 21 or an insulation thin-film layer 32 to implement a corrugated structure. The shape of the recessed holes 33 is not restricted to a circle as shown in FIG. 6.

In the corrugated structure 30, the pitch P between the dots 31 or the recessed holes 33 has a value in a range of $\lambda/4$ through $4\lambda$ of the wavelength of light produced from the fluorescent layer 24, or in a range of 100–2400 nm. The corrugated structure 30 has a height H less than the height HP of the fluorescent layer 24. Substantially, the fluorescent layer 24 has a thickness of 600 nm. It is preferable to set the height of the corrugated structure 30 taking account of the thicknesses of the fluorescent layer 24, the first electrode layer 22, and the first insulation layer 23, such that a layer can be formed on the fluorescent layer 24, following the shape of the corrugated structure 30. It is preferable to set the height of the corrugated structure 30 to be at least 50 nm, and less than the thickness of the fluorescent layer 24.

The diameter D of the dots 31 or the recessed holes 33, and the pitch P in the corrugated structure 30, directly influence light output efficiency. Based on the experiments performed taking account of this fact, it is preferable to set the diameter D to satisfy a formula $0.05 < 2 \times D/P < 0.5$. When $2 \times D/P$ is 0.5 or greater, the dots 31 meet one another, almost removing corrugation. Conversely, when $2 \times D/P$ is 0.05 or less, the dots 31 are too small to be an effective corrugation.

It is preferable that the corrugated structure 30 has substantially the same refractive index as the substrate 21, or a layer in which the corrugated structure 30 is formed. The corrugated structure 30 can be made of an inorganic material, such as transparent $SiO_2$ or polyimide, or a polymer material. However, the present invention is not restricted to the above embodiments.

When a predetermined voltage is applied to the electroluminescence display device 20 through the first and second electrode layers 22 and 26, electrons pass through the first and second insulation layers 22 and 25 and are injected into the fluorescent layer 24. The electrons accelerated by a magnetic field move toward the fluorescent layer 24 to collide with atoms, i.e., luminescence centers, to excite the electrons of the luminescence centers. When the excited electrons make the transition to a ground state, light of a particular wavelength corresponding to an energy difference around the electrons is produced, which is referred to as an electroluminescence phenomenon. When an AC voltage, or alternate positive and negative voltages having a predetermined waveform, is repeatedly applied, as many electroluminescence phenomena as the number of pulses occurs in alternate opposite directions so that luminescence of the fluorescent layer 24 can be maintained.

Figure 7:
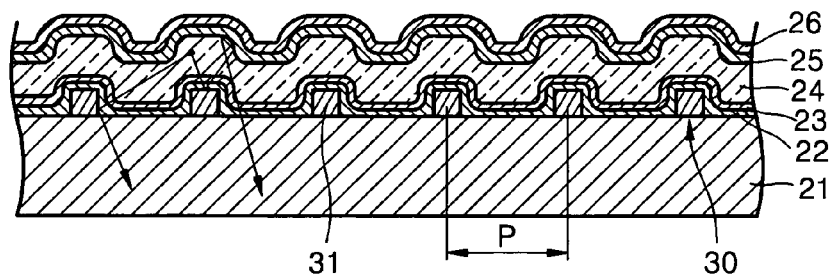
FIG. 7 is a cross-section of an electroluminescence display device according to an embodiment of the present invention, which shows the operation of the electroluminescence display device.

Light produced from the fluorescent layer 24 is output through the substrate 21. Since the first electrode layer 22, the first insulation layer 23, the fluorescent layer 24, the second insulation layer 25, and the second electrode layer 26 have corrugations, due to the corrugated structure 30 composed of the dots 31 formed on the substrate 21 in the predetermined pitch P, as shown in FIG. 7, light incident on an interface at a threshold or greater angle is prevented from being guided inward due to a refractive index difference at the interface, and is therefore dispersed. Consequently, the light is prevented from being lost between the layers constituting the electroluminescence display device.

In other words, since the refractive index of the fluorescent layer 24 is relatively higher than those of the first and second electrode layers 22 and 26 and the first and second insulation layers 23 and 25, light is reflected at an interface there between. However, due to the corrugation of each layer, light incident on the interface in parallel does not progress horizontally, but is output through the substrate 21, thereby increasing light output efficiency.

By comparing the amount of light output from an electroluminescence display device having a corrugated structure according to these embodiments of the present invention with the amount of light output from an electroluminescence display device not having the corrugated structure, it can be proved that the present invention achieves an increase in light output efficiency.

EXPERIMENTAL EXAMPLE 1

In this experiment, when manufacturing an electroluminescence display device, a corrugated structure including dots having a cylindrical shape was formed using $SiO_2$ on the top surface of a substrate. A pitch between the dots was 620 nm, and the dots were 200 nm in height and 220 nm in diameter. A first electrode layer, a first insulation layer, a fluorescent layer, a second insulation layer, and a second electrode layer were corrugatedly formed on the substrate, following the shape of the corrugated structure.

EXPERIMENTAL EXAMPLE 2

In this experiment, when manufacturing an electroluminescence display device, a corrugated structure including dots having a cylindrical shape was formed using $SiO_2$ on the top surface of a substrate. A pitch between the dots was 420 nm, and the dots were 200 nm in height and 220 nm in diameter. A first electrode layer, a first insulation layer, a fluorescent layer, a second insulation layer, and a second electrode layer were corrugatedly formed on the substrate, following the shape of the corrugated structure.

COMPARISON EXAMPLE 1

When manufacturing an electroluminescence display device without forming a corrugated structure, a first electrode layer, a first insulation layer, a fluorescent layer, a second insulation layer, and a second electrode layer were flatly formed on the top surface of a substrate.

The electroluminescence of each electroluminescence display device manufactured in Experimental Examples 1 and 2, and Comparison Example 1, was measured using a spectrophotometer in order to estimate light output efficiency. Luminance and light output efficiency were measured under the condition that a variable 500 Hz sine wave voltage was applied for excitation. In particular, they were measured at threshold voltages of 40 and 60 V. As a result, with respect to the electroluminescence display devices respectively manufactured in Experimental Example 1 and Comparison Example 1, the graph of the applied voltage versus luminance shown in FIG. 8 was obtained. In addition, the luminance and light output efficiency, which were measured at the threshold voltages in the electroluminescence display devices respectively manufactured in Experimental Examples 1 and 2, and Comparison Example 1, were obtained as shown in the following table.

TABLE

| | Pitch between dots (nm) | Diameter of dots (nm) | Height of dots (nm) | Luminance (cd/m$^2$) | | Light output efficiency (lm/W) | |
|---|---|---|---|---|---|---|---|
| | | | | Voltage (40 V) | Voltage (60 V) | Voltage (40 V) | Voltage (60 V) |
| Experimental Example 1 | 620 | 220 | 200 | 1780 | 1940 | 1.002 | 0.879 |
| Experimental Example 2 | 420 | 220 | 200 | 1040 | 1190 | 0.670 | 0.587 |
| Comparison Example 1 | | | | 688 | 763 | 0.475 | 0.405 |

Figure 8:
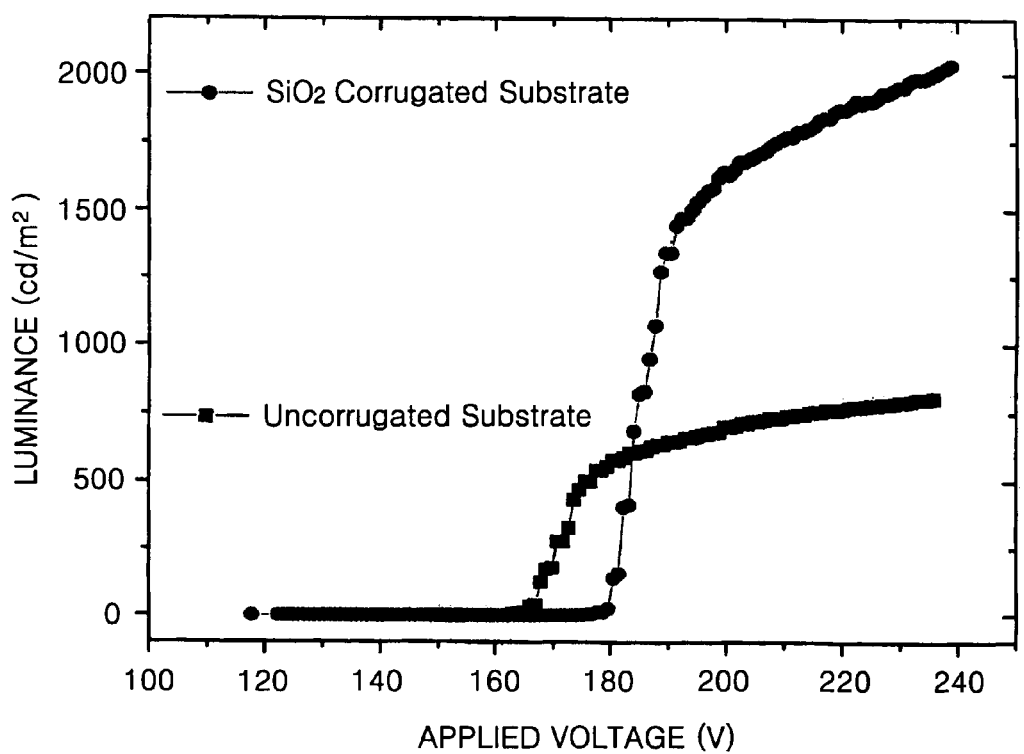
FIG. 8 is a graph of luminance versus applied voltage in an electroluminescence display device having a corrugated structure and in an electroluminescence display device having an uncorrugated structure.

As is seen from the graph shown in FIG. 8, the electroluminescence display device having the corrugated structure on the substrate has 2.6 or more times higher luminance than the electroluminescence display device not having the corrugated structure.

In addition, as is seen from the above table, each electroluminescence display device having the corrugated structure on the substrate has 2.4 or more times higher luminance and 2.3 and more times higher light output efficiency than the electroluminescence display device not having the corrugated structure.

Figure 9A:
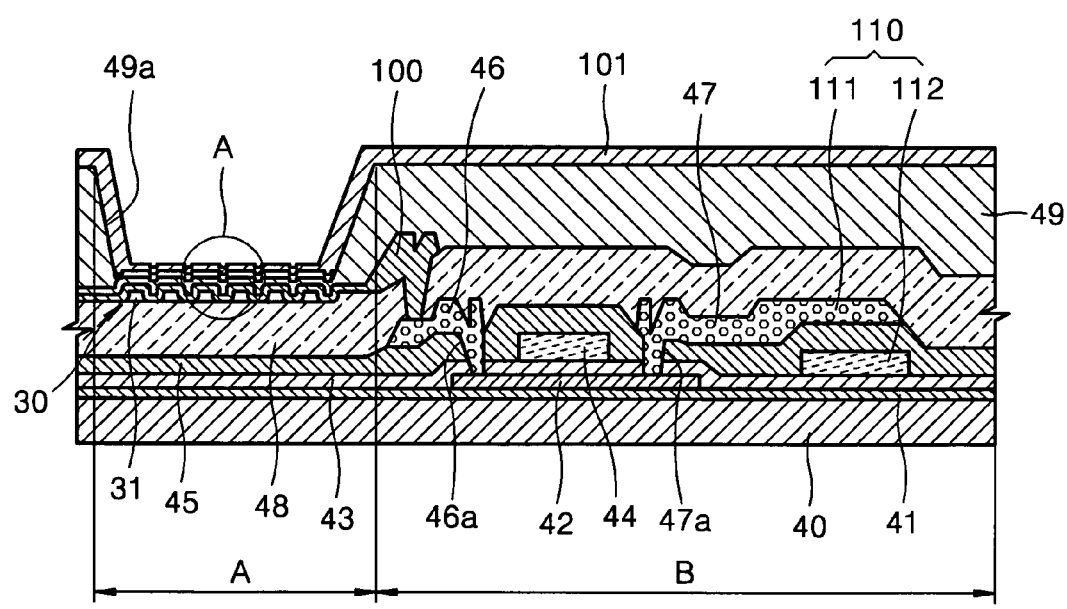
FIG. 9A is a cross-section of an electroluminescence display device according to still another embodiment of the present invention.
Figure 9B:
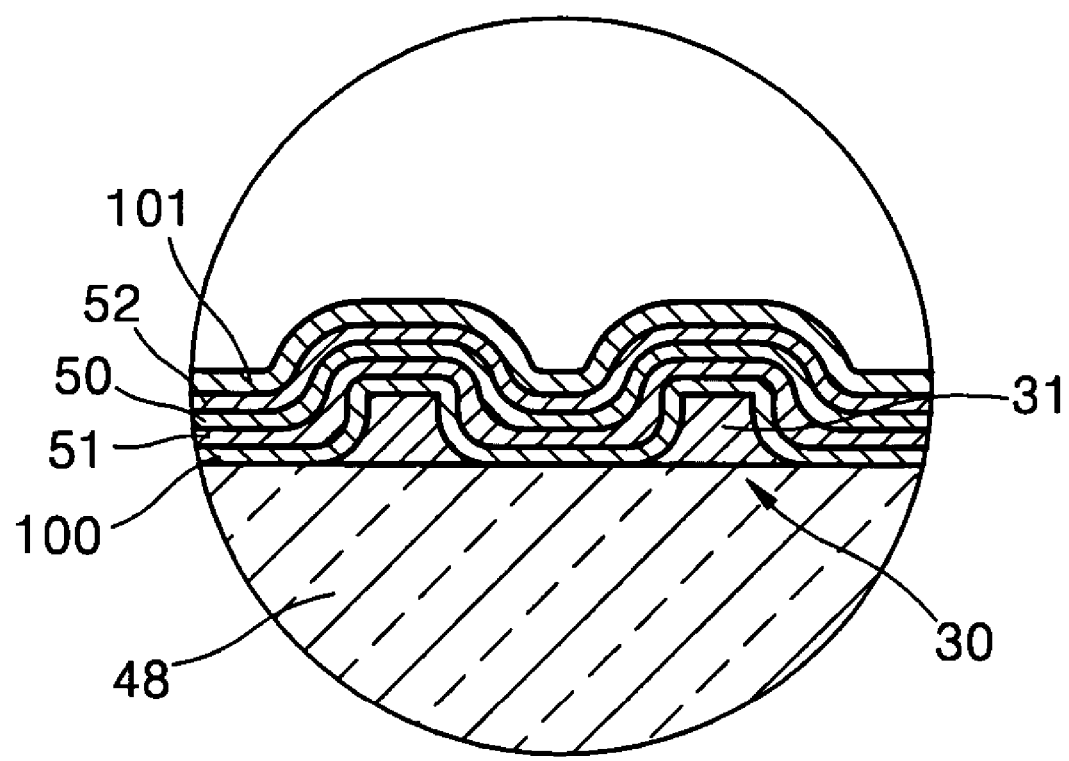
FIG. 9B is an enlarged view of the part C shown in FIG. 9A.

FIGS. 9A and 9B show an electroluminescence display device according to still another embodiment of the present invention. Referring to FIGS. 9A and 9B, a buffer layer 41 is formed on a transparent substrate 40. A pixel area A, for forming a pixel, and a driving area B, in which a thin film transistor (TFT) and a capacitor are formed, are defined above the buffer layer 41.

In the driving area B, a p-type or n-type semiconductor layer 42, which is arranged in a predetermined pattern on the top surface of the buffer layer 41, is covered with a gate insulation layer 43. A gate electrode layer 44, corresponding to the semiconductor layer 42, is formed on the top surface of the gate insulation layer 43, and is covered with a first insulation layer 45. In addition, a drain electrode 46 and a source electrode 47 are formed on the top surface of the first insulation layer 45 so that they are connected to both ends of the semiconductor layer 42 through contact holes 46a and 47a, which are formed in the first insulation layer 45 and the gate insulation layer 43. A first auxiliary electrode 111 is formed on the top surface of the first insulation layer 45 to be connected to the source electrode 47. A second auxiliary electrode 112 is formed to face the first auxiliary electrode 111 and to be covered with the first insulation layer 45. The first and second auxiliary electrodes 111 and 112 constitute a capacitor 110. A second insulation layer 48 is formed on the top surface of the first insulation layer 45. A corrugated structure 30 composed of dots 31, which is the same as described in the above embodiments, is formed on the top surface of the second insulation layer 48, or a portion of the second insulation layer 48, in the pixel area A.

In the pixel area A, a third insulation layer 49 having an opening 49a is formed on the top surface of the second insulation layer 48. A first electrode layer 100, electrically connected to the drain electrode 46, is corrugatedly formed on the bottom of the opening 49a in the third insulation layer 49, i.e., on the top surface of the second insulation layer 48, on which the corrugated structure 30 is formed, following the shape of the corrugated structure 30. A fluorescent layer 50 is formed on the top surface of the first electrode layer 100. A second electrode layer 101 is formed on the top surfaces of the fluorescent layer 50 and the third insulation layer 49. Fourth and fifth insulation layers 51 and 52 are formed between the respective first and second electrodes 100 and 101 and the fluorescent layer 50. Here, the fluorescent layer 50 and the portions of the first and second electrode layers 100 and 101 and the fourth and fifth insulation layers 51 and 52, which correspond to the fluorescent layer 50, are corrugatedly formed, following the shape of the corrugated structure 30 formed on the second insulation layer 48. As described in the above embodiments, the refractive index of the fluorescent layer 50 is relatively higher than those of the first through fifth insulation layers 45, 48, 49, 51, and 52.

Alternatively, in an electroluminescence display device using a TFT, the corrugated structure 30 can be formed on the top surface of the first insulation layer 45.

In the above described electroluminescence display device, when a predetermined voltage is applied to the first and second electrode layers 100 and 101 by a selected TFT, light is produced from the fluorescent layer 50, through electroluminescence, and is output. Here, due to the corrugations of the fluorescent layer 50, the first and second electrode layer 100 and 101, and the fourth and fifth insulation layers 51 and 52, light incident at a threshold or greater angle from the fluorescent layer 50 on an interface therebetween is scattered so that the light has an incident angle less than the threshold angle. Consequently, the reflective index of the interface is remarkably reduced.

Figure 10:
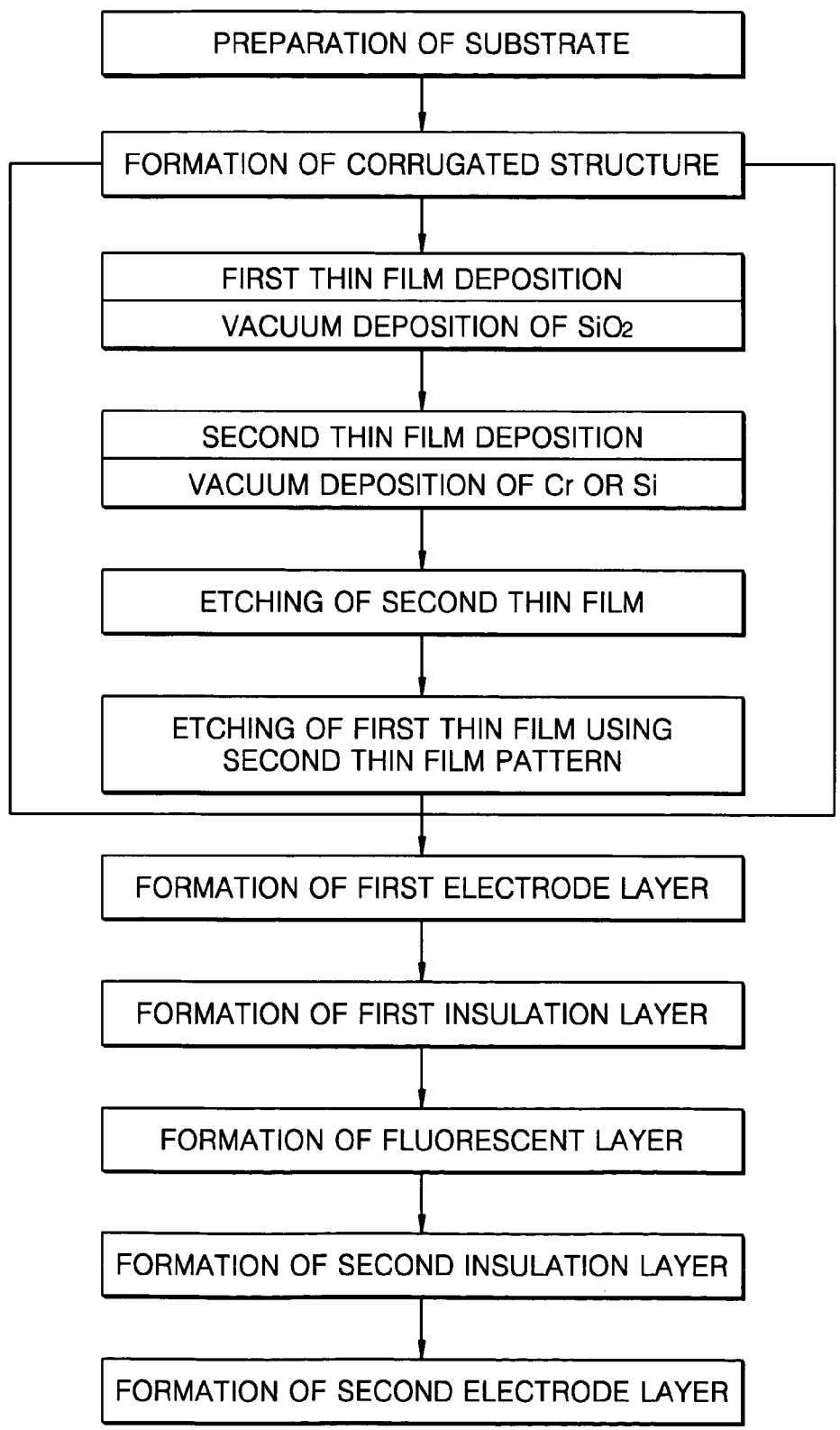
FIG. 10 is a flowchart of a method of manufacturing an electroluminescence display device according to an embodiment of the present invention.

FIG. 10 is a flowchart of a method of manufacturing an electroluminescence display device according to an embodiment of the present invention. Referring to FIG. 10, a substrate is prepared. A corrugated structure for dispersing light through diffraction and reflection is formed on the top surface of the substrate. Here, if the electroluminescence display device is designed to output light through the substrate, the substrate must be made of a transparent material such as glass.

The formation of the corrugated structure can be divided into a plurality of processes, which will be described below.

After cleaning the substrate, $SiO_2$ is deposited to a thickness of 5000 Å using a vacuum deposition method, thereby forming a first thin film. In order to mask the first thin film, Cr or Si is deposited on the first thin film to a thickness of 500 Å, thereby forming a second thin film. A photoresist layer is formed on the top surface of the second thin film and then patterned using a laser scanning or hologram method. Thereafter, the second thin film is etched. After completely etching the second thin film in a predetermined pattern, the first thin film is etched using the etched second thin film, thereby forming the corrugated structure including dots arranged in a predetermined pitch.

After forming the corrugated structure, including the dots having a predetermined size on the substrate, a first electrode layer, a first insulation layer, a fluorescent layer, a second insulation layer, and a second electrode layer are sequentially formed on the substrate to have corrugations following the shape of the corrugated structure.

A method of forming a corrugated structure on a substrate according to the present invention is not restricted to the above embodiment. For example, the corrugated structure can be formed on the first or second insulation layer.

An electroluminescence display device according to the present invention includes a corrugated structure in order to form corrugations in a fluorescent layer or an insulation layer, thereby reducing internal light loss and increasing light output efficiency. In particular, the present invention allows the light output efficiency of an inorganic electroluminescence display device to be increased, thereby making it possible to practically use the inorganic electroluminescence display device.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An electroluminescence display device comprising:
   a substrate;
   a corrugated structure formed on the substrate, wherein the corrugated structure is arranged in a predetermined pitch and disperses light through diffraction and reflection; and
   a first electrode layer, a first insulation layer, a fluorescent layer, a second insulation layer, and a second electrode layer sequentially formed on the substrate to follow a shape of the corrugated structure.

2. The electroluminescence display device of claim 1, wherein the corrugated structure comprises a plurality of dots, each dot having a cylindrical shape or a polygonal cone shape, and arranged in the predetermined pitch.

3. An electroluminescence display device comprising:
   a substrate;
   a corrugated structure comprising a thin-film layer having a plurality of holes formed in a predetermined pattern in the thin-film layer and dispersing light through diffraction and reflection; and
   a first electrode layer, a first insulation layer, a fluorescent layer, a second insulation layer, and a second electrode layer seguentially formed on the substrate to follow a shape of the holes in the thin film layer.

4. The electroluminescence display device of claim 1, wherein the corrugated structure comprises a material having substantially a same refractive index as the substrate.

5. The electroluminescence display device of claim 4, wherein the material comprises $SiO_2$, $SiO_2$ aerogel, silicon polymer, BCB, or polyimide.

6. The electroluminescence display device of claim 1, wherein a the pitch between corrugating members of the corrugated structure is $\lambda/4$ to $4\lambda$ of a wavelength of light produced from the fluorescent layer.

7. The electroluminescence display device of claim 6, wherein the pitch between corrugating members of the corrugated structure is 100–2400 nm.

8. The electroluminescence display device of claim 1, wherein a height of corrugating members of the corrugated structure is 50–1000 nm.

9. An electroluminescence display device comprising:
   a substrate;
   a corrugated structure formed on the substrate; and
   a first electrode layer, a first insulation layer, a fluorescent layer, a second insulation layer, and a second electrode layer sequentially formed on the substrate to follow the a shape of the corrugated structure, wherein:
      the corrugated structure comprises a plurality of dots arranged in a predetermined pitch, each dot having a cylindrical shape or a polygonal cone shape,
      a shape of a top surface of each dot is a circle, and
      a relationship between a diameter of the circle and the pitch between the dots satisfies a formula of $0.05 < 2 \times D/P < 0.5$, wherein D and P represent the diameter and pitch, respectively.

10. The electroluminescence display device of claim 1, wherein the fluorescent layer has a higher refractive index than the adjacent first and second insulation layers.

11. The electroluminescence display device of claim 1, wherein the fluorescent layer comprises an oxide or sulfide having a refractive index of more than 1.6 as a base material.

12. An electroluminescence display device comprising:
   a transparent substrate;
   a corrugated structure having a predetermined pitch and dispersing light through diffraction and reflection; and
   a first electrode layer, a first insulation layer, a fluorescent layer, a second insulation layer, and a second electrode layer sequentially formed on the substrate,
   wherein the corrugated structure is formed on the substrate or on at least one of the sequentially formed layers, and at least one of the sequentially formed layers is formed on the corrugated structure to follow a shape of the corrugated structure.

13. The electroluminescence display device of claim 12, wherein:
   the corrugated structure comprises a plurality of dots,
   each dot has a cylindrical shape or a polygonal cone shape, and
   the plurality of dots are arranged in the predetermined pitch.

14. The electroluminescence display device of claim 12, wherein the corrugated structure comprises transparent $SiO_2$ or polyimide.

15. The electroluminescence display device of claim 12, wherein a predetermined pitch between corrugating members of the corrugated structure is $\lambda/4$ to $4\lambda$ of a wavelength of light produced from the fluorescent layer.

16. The electroluminescence display device of claim 15, wherein the predetermined pitch is 100–2400 nm.

17. The electroluminescence display device of claim 12, wherein a height of corrugating members of the corrugated structure is 50–1000 nm.

18. An electroluminescence display device comprising:
   a transparent substrate;

a corrugated structure dispersing light through diffraction and reflection; and a first electrode layer, a first insulation layer, a fluorescent layer, a second insulation layer, and a second electrode layer sequentially formed on the substrate, wherein:

the corrugated structure is formed on the substrate or on at least one of the sequentially formed layers, and at least one of the sequentially formed layers is formed on the corrugated structure to follow a shape of the corrugated structure, the corrugated structure comprises a plurality of dots, each dot has a cylindrical shape or a polygonal cone shape, the dots are arranged in a predetermined pitch, and a shape of a top surface of each dot is a circle, and a relationship between a diameter of the circle and a pitch between the dots satisfies a formula of $0.05<2\times D/P<0.5$, wherein D and P represent the diameter and pitch, respectively.

19. The electroluminescence display device of claim 12, wherein the fluorescent layer has a higher refractive index than adjacent layers.

20. The electroluminescence display device of claim 12, wherein the fluorescent layer comprises an oxide or sulfide having a refractive index of more than 1.6 as a base material.

21. The electroluminescence display device of claim 12, further comprising a thin film transistor layer driving the first electrode layer and the second electrode layer.

22. The electroluminescence display device of claim 12, wherein the fluorescent layer comprises red, green, and blue layers formed in a predetermined pattern, and is formed between the first electrode layer and the second electrode layer, the first and second electrode layers also formed in a predetermined pattern.

23. An electroluminescence display device comprising:

a substrate having a planar surface and a plurality of identifiable geometric shapes projecting from the planar surface, each identifiable geometric shape having a first end integrally formed with the planar surface and a second end displaced from the planar surface by a predetermined distance and parallel with the planar surface; and a first electrode layer, a first insulation layer, a fluorescent layer, a second insulation layer, and a second electrode layer sequentially formed on the substrate and following a shape of the plurality of identifiable geometric shapes.

24. The electroluminescent display device of claim 23, wherein a cross section of each identifiable geometric shape taken between the first end and the second end is cylindrical.

25. The electroluminescent display device of claim 23, wherein:

respective cross sections of each identifiable geometric shape taken at first and second displacements from the first end are cylindrical, and a diameter of the cross section taken at the second displacement is smaller than a diameter of the cross section taken at the first displacement.

26. The electroluminescent display device of claim 23, wherein respective cross sections of the identifiable geometric shape taken at first and second displacements from the first end are square.

27. The electroluminescent display of claim 26, wherein areas of the respective cross sections at the first and second displacements are equal.

* * * * *

UNITED STATES PATENT AND TRADEMARK OFFICE
CERTIFICATE OF CORRECTION

PATENT NO. : 7,176,621 B2  
APPLICATION NO. : 10/715416  
DATED : February 13, 2007  
INVENTOR(S) : Young-Rag Do et al.

Page 1 of 1

It is certified that error appears in the above-identified patent and that said Letters Patent is hereby corrected as shown below:

Claim 3 column 9, line 63
    change "seguentially" to --sequentially--

Claim 6 column 10, line 5
    delete "a"

Signed and Sealed this

Fifth Day of June, 2007

JON W. DUDAS  
*Director of the United States Patent and Trademark Office*